United States Patent
Kian et al.

(10) Patent No.: US 9,520,509 B2
(45) Date of Patent: Dec. 13, 2016

(54) SHEET ASSEMBLY WITH ALUMINUM BASED ELECTRODES

(75) Inventors: Kourosh Kian, Altadena, CA (US); Peikang Liu, Claremont, CA (US); Stephen Li, Huntington Beach, CA (US)

(73) Assignee: AVERY DENNISON RETAIL INFORMATION SERVICES, LLC, Westborough, MA (US)

( * ) Notice: Subject to any disclaimer, the term of this patent is extended or adjusted under 35 U.S.C. 154(b) by 425 days.

(21) Appl. No.: 14/003,517

(22) PCT Filed: Mar. 12, 2012

(86) PCT No.: PCT/US2012/028825
§ 371 (c)(1),
(2), (4) Date: Dec. 16, 2013

(87) PCT Pub. No.: WO2012/125587
PCT Pub. Date: Sep. 20, 2012

(65) Prior Publication Data
US 2014/0166098 A1    Jun. 19, 2014

Related U.S. Application Data

(60) Provisional application No. 61/451,661, filed on Mar. 11, 2011.

(51) Int. Cl.
*H01L 31/05*    (2014.01)
*H01L 31/0224*    (2006.01)
(Continued)

(52) U.S. Cl.
CPC ... *H01L 31/022441* (2013.01); *C23C 18/1651* (2013.01); *C23C 18/1653* (2013.01);
(Continued)

(58) Field of Classification Search
CPC .......... H01L 21/02098; H01L 21/0226; H01L 21/02296; H01L 21/02334
See application file for complete search history.

(56) References Cited

U.S. PATENT DOCUMENTS 3,726,771 A    4/1973    Coll
5,448,021 A    9/1995    Arai
(Continued)

FOREIGN PATENT DOCUMENTS

| | | |
|---|---|---|
| GB | 1355933 A | 6/1974 |
| JP | 2002 237497 A | 8/2002 |
| JP | 2010221262 A | 10/2010 |

OTHER PUBLICATIONS

Jong, P. C., et al. "Single-step laminated full-size PV modules made with back-contacted MC-Si cells and conductive adhesives." 19th EPVSEC, Paris (2004): 2145. http://www.ecn.nl/docs/library/report/2004/rx04067.pdf.*

(Continued)

*Primary Examiner* — Cheung Lee
(74) *Attorney, Agent, or Firm* — Avery Dennison Retail Information Services, LLC

(57) ABSTRACT

Various methods for preparing and/or processing electrically conductive aluminum members such as used in electronic circuits and components are described. Also described are various sheet assemblies using patterned aluminum conductive elements as components of electric circuitry. The sheet assemblies can be used as backsheets for back contact photovoltaic cells or as antennas for RFID tags.

21 Claims, 6 Drawing Sheets

(51) Int. Cl.
    *H01L 21/02*     (2006.01)
    *C23C 18/54*     (2006.01)
    *C23C 18/16*     (2006.01)
    *C25D 7/12*     (2006.01)
    *H01L 31/18*     (2006.01)

(52) U.S. Cl.
    CPC .............. *C23C 18/54* (2013.01); *C25D 7/126* (2013.01); *H01L 21/02343* (2013.01); *H01L 31/0516* (2013.01); *H01L 31/18* (2013.01); *Y02E 10/50* (2013.01)

(56) References Cited

U.S. PATENT DOCUMENTS

| | | |
|---|---|---|
| 5,468,652 A | 11/1995 | Gee |
| 5,951,786 A | 9/1999 | Gee |
| 6,028,011 A | 2/2000 | Takase et al. |
| 2004/0112636 A1* | 6/2004 | Kawai et al. .... G06K 19/07745 174/263 |
| 2008/0277146 A1 | 11/2008 | Hwang et al. |
| 2009/0101206 A1 | 4/2009 | Diklich |
| 2010/0012172 A1 | 1/2010 | Meakin et al. |

OTHER PUBLICATIONS

Bultman, et al, "Selecting Optimal Interconnection Methodology for Easy and Cost Efficient Manufacturing of the Pin Up Module", XP002677160, ftp://ftp.ecn.nl/pub/www/library/report/2002/rx02051.pdf, (Jun. 4, 2012).

Bultman, et al, "Fast and Easy Single Step Module Assembly for Back-Contacted C-Si Solar Cells With Conductive Adhesives", Proceedings of 3rd World Conference on Photovoltaic Energy Conversion (vol. 1), 979-982 vol. 1, May 11-18, 2003.

Gee, James, "Back-contact solar cells/modules for next-generation of cSi PVs", Renewable Energy World, Mar. 21, 2009.

\* cited by examiner

SHEET ASSEMBLY WITH ALUMINUM BASED ELECTRODES

CROSS-REFERENCE TO RELATED APPLICATION

The present application is a 371 of International Application No. PCT/US12/28825, which was published in English on Sep. 20, 2012, and claims priority to U.S. Provisional Application No. 61/451,661 filed Mar. 11, 2011, both of which are incorporated herein by reference in their entireties.

FIELD OF THE INVENTION

The present invention relates to sheet assemblies with aluminum based electrodes. More particularly, the present invention relates to backsheet assemblies for back contact photovoltaic cells and methods of making such assemblies. Furthermore, the present invention relates to sheet assemblies with aluminum based electrodes and methods for producing such sheet assemblies that may be used in manufacturing intricately formed circuits, antennas, photovoltaic cells and other specialized applications.

BACKGROUND OF THE INVENTION

A new type of photovoltaic (PV) module includes various silicon wafers that are electrically connected to a conductive backsheet or member. Unlike traditional designs, this type of photovoltaic cell employs laser drilled vias connecting the front surface carrier collector junction to an electrode grid on the back surface. Therefore, the back contact silicone cells use only coplanar contacts on the back surface (as described in U.S. Pat. Nos. 5,468,652 and 5,951,786, both to Gee) and avoid the difficulty in making the front to back lead attachment. This coplanar connection allows all the cells in a photovoltaic module to be electrically connected in a single step. Collections of these cells are referred to as a monolithic module assembly (MMA).

Copper (Cu) has been used as the electrode for the backsheet assembly for back contact photovoltaic cells. Since copper is expensive, there is a need to use less expensive conductive materials. The same is true for other situations where a laser patterned conductive element is preferred. Aluminum is desired for many backsheet contact photovoltaic applications due to its relatively low cost.

However, a naturally occurring oxide layer exists on the surface of aluminum. The oxide layer exhibits relatively high electrical resistance. And so, if electrical connections are to be made to the aluminum electrode(s), the oxide layer must be removed.

Although various methods are known for removing oxide layers from electrically conductive members, many of those methods are expensive or time consuming and treat an entire sheet of aluminum foil. Another consequence associated with removal of oxide from aluminum is that after removal of an oxide layer, that layer quickly re-oxidizes even under ambient conditions. Furthermore, aluminum electrodes rapidly re-oxidize if subjected to high temperatures and/or high humidity. Accordingly, a need exists for a method by which aluminum based electrodes, and particularly those used in photovoltaic assemblies, can be economically prepared or processed to be resistant to oxidation yet be electrically conductive.

SUMMARY OF THE INVENTION

The difficulties and drawbacks associated with previously known systems are addressed in the present methods, assemblies, and devices.

In one aspect, the present invention provides a method of forming an oxidation resistant aluminum based electrode on an aluminum foil laminate for a photovoltaic back contact c-Si cell. The method comprises providing an aluminum foil laminate, including an aluminum foil having a layer of oxidation on the aluminum foil. The method also comprises patterning the aluminum foil of the aluminum foil laminate. The method also comprises removing at least a portion of the oxidation from the aluminum foil, to thereby form a region of freshly exposed aluminum. And, the method comprises depositing at least one layer of an electrically conductive material on the region of freshly exposed aluminum, to thereby form the oxidation resistant electrode on the aluminum foil laminate.

In another aspect, the present invention provides a method of forming an oxidation resistant electrode on an aluminum foil laminate. The method comprises providing an aluminum or aluminum alloy foil having an outer surface that is naturally oxidized. The aluminum or aluminum alloy foil is laminated to a polymer film. The method also comprises removing at least a portion of the oxidation from the outer surface of the aluminum foil to form a region of freshly exposed aluminum. The method additionally comprises depositing at least one layer of an electrically conductive material on the region of freshly exposed aluminum to thereby form the oxidation resistant electrode.

In another aspect, the present invention provides a method of forming an oxidation resistant electrode on an aluminum foil laminate. The method comprises providing an aluminum or aluminum alloy foil having an outer surface that is naturally oxidized. The aluminum or aluminum alloy foil is laminated to a polymer film. The method also comprises providing an oxygen-free atmosphere along the outer surface of the aluminum foil. The method further comprises removing at least a portion of the oxidation from the outer surface of the aluminum foil to form a region of freshly exposed aluminum. The method additionally comprises depositing at least one layer of an electrically conductive material on the region of freshly exposed aluminum, while maintaining the oxygen-free atmosphere along the outer surface of the aluminum foil to thereby form the oxidation resistant electrode on the aluminum foil laminate.

In another aspect, the present invention provides a method of forming a sheet assembly having at least one patterned aluminum based electrode. The method comprises providing a substrate and depositing adhesive on the substrate in a pattern to form a layer of adhesive defining at least one adhesive-free region on the substrate. The method also comprises laminating a thin layer of an aluminum foil on the layer of adhesive wherein the aluminum foil is disposed on the adhesive and extends over the at least one adhesive-free region on the substrate. The method further comprises perforating or cutting the aluminum foil along the same pattern of the adhesive to thereby form a layer of the aluminum foil disposed on the layer of adhesive and a remainder portion that extends over the at least one adhesive-free region on the substrate to thereby form an intermediate assembly. The method additionally comprises removing the remainder portion of the aluminum foil from the intermediate assembly. The method also comprises depositing an interlayer dielectric on at least a portion of the layer of the aluminum foil. And, the method further comprises applying at least one surface treatment layer over the aluminum foil which is not covered by the interlayer dielectric to thereby form a sheet assembly having at least one patterned aluminum based electrode.

In another aspect, the present invention provides a method of forming a sheet assembly having at least one patterned aluminum electrically conductive element. The method comprises providing a substrate and depositing adhesive on the substrate in a pattern to form a layer of adhesive defining at least one adhesive-free region on the substrate. The method also comprises laminating a thin layer of an aluminum material on the layer of adhesive wherein the aluminum material is disposed on the adhesive and extends over the at least one adhesive-free region on the substrate. The aluminum material includes an oxide layer. The method additionally comprises perforating or cutting the aluminum material along the same pattern of the adhesive to thereby form a layer of the aluminum material disposed on the layer of adhesive and a remainder portion that extends over the at least one adhesive-free region on the substrate to thereby form an intermediate assembly. The method also comprises removing the remainder portion of the aluminum material from the intermediate assembly. The method also comprises removing the oxide layer from selected areas of the aluminum material. The method also comprises applying at least one surface treatment layer on the layer of the aluminum material of the intermediate assembly. The method additionally comprises depositing an interlayer dielectric on at least a portion of the layer of the aluminum material. And, the method comprises depositing a layer of silver or organic solderability preservative (OSP) on the surface treatment layer to thereby form a sheet assembly having at least one patterned aluminum electrically conductive element.

In yet another aspect, the present invention provides a photovoltaic cell comprising a c-Si cell, and a conductive backsheet. The backsheet comprises a substrate layer, and an aluminum foil on the substrate layer. The aluminum foil is in electrical contact with the c-Si cell and the aluminum foil includes at least one oxidation resistant electrode that includes at least one surface treatment layer.

As will be realized, the invention is capable of other and different embodiments and its several details are capable of modifications in various respects, all without departing from the invention. Accordingly, the drawings and description are to be regarded as illustrative and not restrictive.

BRIEF DESCRIPTION OF THE DRAWINGS

These, as well as other objects and advantages of this invention, will be more completely understood and appreciated by referring to the following more detailed description of the presently preferred exemplary embodiments of the invention in conjunction with the accompanying drawings, of which.

DETAILED DESCRIPTION OF THE EMBODIMENTS

The present invention is based upon a discovery that aluminum foils, and particularly those used in various photovoltaic applications, can be economically prepared and/or processed to remove oxide layers residing on the aluminum foil, and then subjected to an operation in which one or more thin layer(s) of another electrically conductive material are deposited on the aluminum to thereby protect the underlying aluminum from oxidation, yet provide an electrically conductive surface. Additional and optional operations may be performed to deposit another layer of an electrically conductive material on the layer of material previously deposited on the aluminum.

Figure 6:
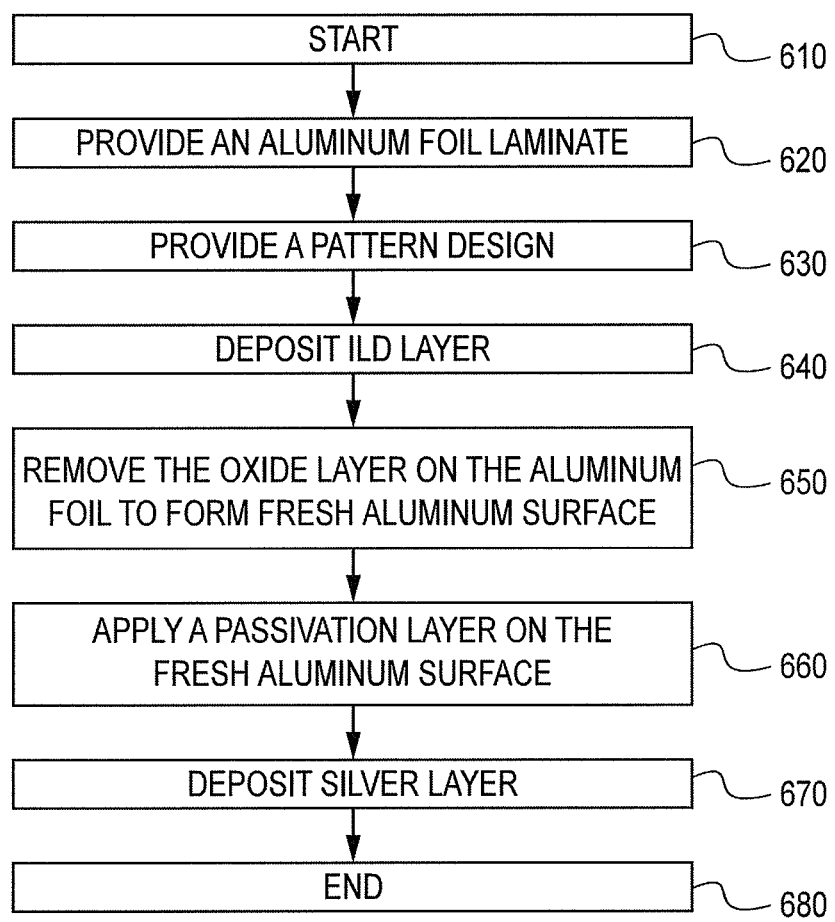
FIG. 6 depicts a preferred embodiment process for manufacturing a sheet assembly in accordance with the present invention.

Reference is now directed to FIG. 6, which illustrates a preferred embodiment process of producing aluminum based electrodes for a back contact photovoltaic backsheet. Beginning at operation 610, the process preferably begins with providing an aluminum (Al) foil laminate, which can be a thin aluminum foil laminated over a polymer substrate, using adhesive or other laminating methods. Providing an aluminum foil laminate is shown in FIG. 6 as operation 620. A desired pattern design according to which the aluminum based electrodes are to be formed is then provided at operation 630. The pattern ensures proper functioning of the electrical circuit formed when multiple photovoltaic cells are connected to the aluminum based electrodes on the photovoltaic backsheet with proper connectivity and avoids electrical shorting. The aluminum foil can be die-cut, chemically etched or laser cut according to the predetermined pattern. These operations are collectively referred to herein as "patterning." The term "patterning" as used herein also includes other techniques and operations that can produce desired electrical circuit or circuit component configurations. The portion of the aluminum foil that is not part of the desired pattern is removed or stripped off. Next, an inter layer dielectric (ILD) layer is applied over the aluminum layer to cover most of the aluminum surface. Only the regions where electrodes are to be formed are left uncoated. This operation is shown as operation 640. Next, the naturally occurring oxide layer on the aluminum foil where no ILD is coated, is removed. This operation is shown as operation 650. Then a passivation layer is applied immediately over the freshly exposed aluminum surface. Such passivation layer can be formed of copper or nickel. This operation is depicted as operation 660. And lastly, a silver layer is deposited over the ILD to form an oxidation resistant, aluminum based electrode. This operation is shown as operation 670. The deposition of the ILD layer can optionally be performed after the deposition of the silver layer to cover the areas that are not to be used as electrodes. The process is completed at 680.

The removal of the naturally occurring oxide layer on aluminum foil can be achieved through wet chemical etching, or dry laser ablation. In case of wet chemical etching, to minimize the area to be treated, it is preferred to deposit the ILD layer before removal of the oxide layer. In case of dry laser ablation, at least one laser beam can be directed to the desired location on the aluminum foil to remove the oxide layer at that specific location according to the predetermined pattern, leaving the rest of the aluminum foil untouched. In this case, as the aluminum oxide is a dielectric material, the deposition of ILD on the aluminum laminate can be optionally eliminated in some cases. In one embodiment of the invention, one or more particular chemical treatment operation(s) are used to (i) remove any oxide layers from the aluminum conductor, and (ii) deposit at least one electrically conductive material on the freshly exposed aluminum surface. The resulting structure is very stable and exhibits excellent electrical conductivity.

In accordance with another embodiment of the invention, select regions of an aluminum conductor and particularly in a sheet or foil form, are identified. Preferably, only the regions along the sheet at which electrical connections are to be made, are subjected to an oxide removal operation. Preferably, the oxide removal operation is by laser ablation. Then, after removal of oxide in the desired regions, the freshly exposed aluminum is subjected to a plating or other material deposition operation in which an electrically conductive material, preferably copper or nickel, is deposited on the aluminum surface in the freshly exposed regions. Preferably, copper is deposited by electroplating. It is contemplated that a layer of zinc may be deposited by contacting the aluminum with a zincate solution. The deposition or plating prevents, or at least significantly reduces the potential for, re-oxidation of the laser ablated regions of aluminum. After deposition of the copper or nickel, an optional operation may be performed in which a thin layer of silver is deposited on the copper or nickel.

Although each of the oxide removal techniques is described separately and each has various associated preferred aspects, it will be understood that aspects and details of each technique can be combined and/or used in conjunction with each other. Thus, for example, one or more aspects of the chemical treatment techniques can be used in association with the laser ablation techniques and vice versa.

Several other embodiments of the invention are described in which photovoltaic backsheets having one or more aluminum electrodes prepared and/or processed as described herein are provided. The backsheets comprise a substrate and one or more aluminum electrodes which preferably, are in the form of a patterned aluminum conductive layer.

In other embodiments of the invention, photovoltaic cells are provided. These photovoltaic cells preferably include a c-Si cell in electrical connection with a backsheet. The backsheet includes a substrate and a patterned aluminum conductive layer as described herein.

Throughout this disclosure, the term "layer" refers to either a continuous material layer, a discontinuous material layer, or a discrete material layer.

Other features and advantages of the present invention will become apparent to those skilled in the art from the following detailed description. It is to be understood, however, that the detailed description of the various embodiments and specific examples, while indicating preferred and other embodiments of the present invention, are given by way of illustration and not limitation. Many changes and modifications within the scope of the present invention may be made without departing from the spirit thereof, and the invention includes all such modifications.

Removal of Oxide Layer(s) by Chemical Treatments

In one exemplary embodiment of the presently described invention, a sheet assembly is provided and includes a substrate and an aluminum foil layer disposed on the sheet. The aluminum layer is preferably in the form of a pattern and most preferably an electrical circuit including one or more electrical contacts to be formed on the aluminum layer. Although the sheet assembly is preferably in the form of a conductive backsheet for a photovoltaic assembly or module, the present invention is not limited to such. Instead, the sheet assemblies as described herein can be configured for use in a wide range of applications.

The exposed regions or face surfaces of the aluminum are cleaned, preferably by contact with one or more chemical etching solution(s). As will be appreciated, these exposed surfaces typically contain a layer of oxide. A wide array of etchants and/or liquid etching solutions can be used. Typically, such etching solutions include one or more acids such as nitric acid, hydrochloric acid, sulfuric acid, phosphoric acid, and combinations of these acids potentially with other agents. A preferred commercially available liquid acidic etchant is Helios Al Acid Etch 901 available from MacDermid of Waterbury, Conn.

After etching and removal of any oxides, residues, or other unwanted material from the aluminum surface, a coating or layer of an electrically conductive material is then applied or otherwise formed on the freshly cleaned aluminum surface. Preferably, the electrically conductive material is zinc, however other materials could be used. In a preferred embodiment, a zinc layer is formed by the following reaction (I):

$$3Zn(OH)_4^{-2} + 2Al \rightarrow 3Zn + 2Al(OH)_4^{-} + 4OH^{-1} \qquad (I)$$

Preferably, the zinc layer is formed on the freshly exposed aluminum by contacting and preferably by immersing the aluminum in a liquid zincate solution. This immersion process is electroless, i.e. not electroplating, and involves the displacement of zinc from zincate by aluminum. A variety of solutions can be used. A preferred solution is commercially available under the designation Helios Zincate 900 from MacDermid of Waterbury, Conn. Another preferred solution is commercially available under the designation Metex 6811 available from MacDermid of Waterbury, Conn.

Preferably, the zinc layer is formed upon the freshly exposed aluminum (as previously described, the aluminum is exposed by a chemical treatment operation such as etching) while the aluminum surface is precluded from contact with air or oxygen.

If the aluminum is not treated as described herein and oxidizes upon exposure to air, typically, an oxide layer of $Al_2O_3$ forms on the exposed regions of the aluminum. As will be appreciated, typically the oxide layer is not a single layer nor a layer of uniform composition. A typical thickness range of the oxide layer is from about 10 nm to about 50 nm, however the thickness varies greatly depending upon the length of time of exposure to oxygen, temperature, humidity, and other factors. Generally, the outer regions of the oxide layer comprise greater proportions of oxide and may approach concentrations of approximately 100% oxide. The concentration of oxide generally decreases as a function of distance from the exposed face of the oxide layer, toward the interior of the underlying aluminum layer or conductor.

After formation of the zinc layer, a second layer of one or more electrically conductive materials, which functions as a passivation layer to prevent the oxidation of the freshly treated aluminum, are optionally deposited on the zinc layer.

Preferably, the composition of this second electrically conductive layer is 100% of the selected element in its metallic form such as zinc, copper, nickel, silver or combinations thereof. Preferably, a layer of copper or nickel is deposited upon the previously formed zinc layer. Various techniques can be used to deposit copper or nickel, including jetting, or wet deposition processes. In one embodiment of the invention, contact with and preferably immersion in a suitable liquid bath is preferred. A preferred electroless bath for forming a layer of nickel is Niklad 752 or Niklad 724, both commercially available from MacDermid of Waterbury, Conn. Corresponding liquid formulations are also commercially available for depositing a copper layer.

An optional silver layer may be deposited upon the copper or nickel layer. Preferably, the silver layer is formed by contacting and preferably immersing the region of copper or nickel in a silver-containing bath. An example of such a bath is an immersion silver bath commercially available from MacDermid of Waterbury, Conn. under the designation Helios Silver IM 560. It will be understood that the silver can be deposited via an electrolytic (anode) or electroless process. In another embodiment, the Cu layer can be protected with an organic solderability preservative (OSP) coating for subsequence processing instead of plated Ag. This treatment process can utilize a dip coating treatment after the copper plating operation since the plated copper surface is free of oxidation or other contamination. If the copper surface was not immediately treated after plating, the OSP treatment can be applied after a minor etching operation to remove any oxidation which may have occurred on the copper surface, then followed by the dip coating treatment at a later time.

Protecting copper with an OSP treatment may be performed by applying one or more commercially available materials for protecting copper. Several commercially available materials such as Entek Plus Cu-106A, and Entek Cu-56 from Enthone, Inc, West Haven, Conn.; Metex M-667 from MacDermid of Waterbury, Conn.; and Schercoat Plus, Schercoat Plus Lead Free from Atotech of Rockhill, S.C. utilize copper protect technology. These commercially available materials can be used to protect a fresh copper surface and serve as OSP agents.

In a further exemplary embodiment of the presently described invention, the previously described operations produce surface treatment components. Generally, a multi-layer structure results comprising the surface treatment components. These surface treatment components include the products from reaction (I), and the layer of electrically conductive metals deposited thereon. Such components preferably include a layer of zinc, a passivation layer which is an electrically conductive material such as copper or nickel on the zinc, and a layer of silver on the layer of copper or nickel.

In a further exemplary embodiment, a method of making a sheet assembly with patterned aluminum is described and includes the steps of initially providing a substrate. Next, an adhesive is applied to the substrate in a desired pattern or design. Then an aluminum foil or other thin layer is laminated to the substrate and adhered to the patterned adhesive layer. Next, a corresponding perforation or cut pattern is formed in the aluminum foil layer preferably using a laser to create a foil pattern overlying the adhesive and a remaining foil layer portion or matrix. The matrix, i.e. area without any underlying adhesive, is removed from the foil pattern. The previously described surface treatment layer(s) are then performed upon the patterned aluminum foil.

Removal of Oxide Layer(s) by Laser Ablation

Figure 8:
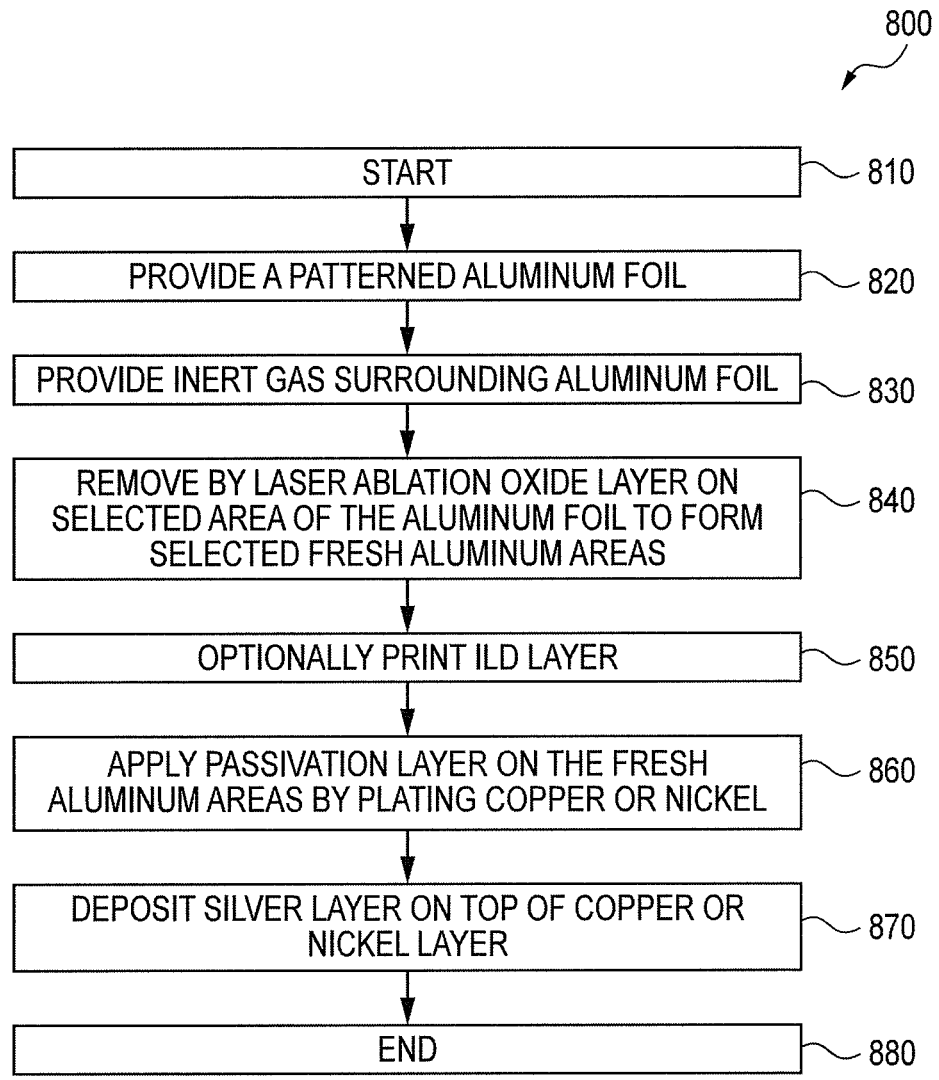
FIG. 8 depicts a preferred embodiment process for processing select regions of a patterned aluminum foil laminate in accordance with the present invention.

In accordance with another aspect of the invention illustrated in the flowchart in FIG. 8, only select regions of a patterned aluminum foil laminate are processed. And so, oxide may remain on other non-selected regions of the aluminum. Referring to the preferred embodiment process depicted in FIG. 8, the process is started at 810. In operation 820, a patterned aluminum foil is provided. In operation 830, an inert gas is provided surrounding the aluminum foil. One or more oxide layers are then removed from the aluminum foil in operation 840. Preferably, the oxide layers are removed by laser ablation. One or more fresh aluminum areas are then selectively formed on the aluminum foil. In operation 850, an interlayer dielectric (ILD) is then optionally applied such as by printing on the aluminum foil. Additional details of ILD's are provided herein. In operation 860, a passivation layer is applied on the fresh aluminum areas. The passivation layer is preferably provided by plating copper or nickel thereon. In operation 870, a silver layer is deposited on the copper or nickel layer. Block 880 designates the end of the process 800.

Figure 7A:
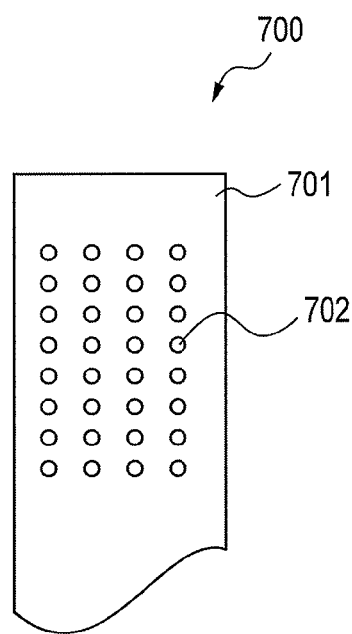
FIG. 7A is a schematic of a preferred embodiment sheet assembly in accordance with the present invention.

In one aspect of the invention, only the regions at which electrical connections are to be made, are subjected to an oxide removal operation. FIG. 7A schematically illustrates a preferred embodiment sheet assembly 700. The preferred sheet assembly is an aluminum laminate having an aluminum layer 701, and a grid of electrodes 702. Aluminum oxide is only removed at the locations where electrodes are to be formed. Preferably, the oxide removal operation is by laser ablation. The laser ablation process is preferably performed in the absence of oxygen.

Figure 7B:
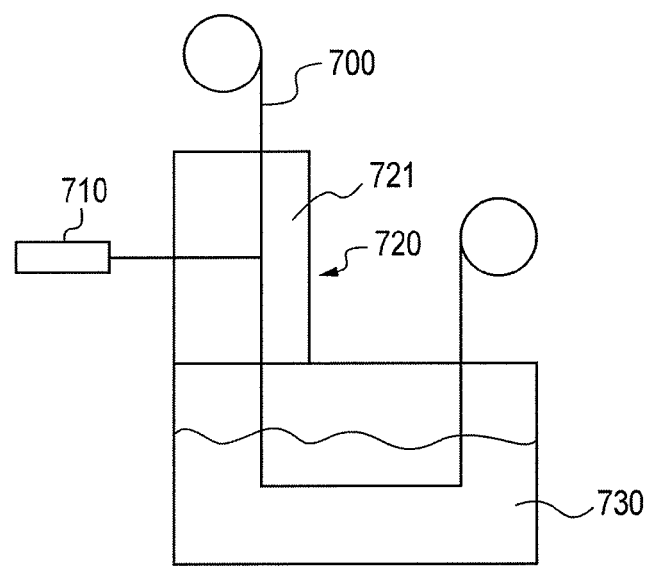
FIG. 7B is a schematic of a preferred embodiment system for manufacturing a sheet assembly according to the present invention.

FIG. 7B is a schematic illustration of a preferred embodiment system for manufacturing a sheet assembly such as the aluminum laminate depicted in FIG. 7A. The system includes a supply such as a roll of an aluminum laminate 700. The sheet material is positioned near laser ablation unit 710. The laser removes oxide in one or more select regions of the laminate, such as in the region(s) at which electrodes 702 are to be formed. The laser ablation process is preferably performed in a chamber 720 and in the presence of one or more inert gases 721. Then, after removal of oxide in the desired regions, the freshly exposed aluminum is protected or passivated by depositing a passivation layer, and preferably by plating in a bath 730 or printing a metal such as copper or nickel in order to prevent re-oxidation of the aluminum. These very thin metal layers oxidize at a slower rate than aluminum and exhibit good adhesion to the freshly exposed aluminum surface. After deposition of the thin metal layer, a layer of silver is then optionally deposited on the thin metal layer to prevent the exposed surface of the thin metal layer from oxidizing. Deposition of a layer of silver also provides for improved oxidation resistance and electrical characteristics and compatibility with other components and/or materials such as a subsequently applied electrically conductive paste used to connect silicon cell pads to the underlying aluminum electrodes.

More specifically, after laser ablation, various processes have been identified for treating the ablated areas of aluminum. One operation involves a plating operation in which copper or nickel is plated on the aluminum surface in the ablated regions to form a passivation layer. The plating prevents, or at least significantly reduces the potential for re-oxidation of the laser ablated regions of aluminum. These areas are then silver plated by silver immersion or electro-plating to completely passivate the aluminum without lowering its conductivity. In a more preferred method, the ablated regions are subjected to a plating operation in which copper or nickel is plated on the aluminum surface in those regions. The areas plated with copper or nickel then receive a thin silver layer comprising a silver nanoparticle ink and optionally followed by drying/sintering of the ink. Preferably, the thin layer of silver nanoparticle ink is deposited by printing. A wide range of nanoparticles can be manufactured from materials such as pure metals, metal oxides, ferro magnets, paramagnetic particles. In case of inkjet printable conducting nanoparticle inks, the solids content is between 20 to 50 wt % in order to meet the rheological requirements for stable jetting in the printhead. Decreasing the particle size, which is typically between 10 to 100 nm, can dramatically reduce the sintering temperature of the metal particles. The sintering temperature of metal nanoparticles is considerably lower than the melting point of the bulk metal, enabling printing on substrates such as paper or polymer films that can only withstand temperatures of about 100° C.

A preferred composition comprising silver nanoparticles is prepared by dispersing the silver nanoparticles in aqueous media. The challenge is to stabilize particles with relatively small quantities of additives. A high proportion of emulsifiers would greatly reduce the conductivity of the printed electronics. Preferred nanoparticles are commercially available from Cabot (Boston, Mass.), Methode (Chicago, Ill.) and others. These silver nanoparticles do not need sintering at temperatures above the softening temperature of their polymer film backings i.e. above 100° C. and provide satisfactory electrical conductivity. In another preferred method, copper or nickel is printed instead of plated on the aluminum surface immediately after the laser ablation phase in the same inert gas chamber. It will be appreciated that although copper or nickel is preferred, other printing compositions containing particles of electrically conductive material could be used. Generally, any printing composition comprising particles of one or more electrically conductive materials dispersed in a carrier or matrix can be used. However, as described herein, copper, nickel, and combinations of such are preferred for the electrically conductive materials. Preferably, the copper or nickel is in the form of small particles dispersed in a composition suitable for printing. Preferably, the copper or nickel particles are nanoparticles. Printing of the copper or nickel particles and preferably nanoparticles and their drying/sintering is performed in the absence of oxygen and in the same type of inert gas used in the laser ablation chamber. Oxygen-free environments are described in greater detail herein. Nanoparticles of copper and nickel are available from suppliers like Applied Nanotech Inc. (Austin, Tex.). The printed areas subsequently receive an optional thin silver layer using silver nanoparticle ink and optionally followed by drying/sintering of this ink. The silver nanoparticle ink is preferably deposited on the printed regions of copper or nickel by printing.

The term "nanoparticles" as used herein refers to particles having very small diameters or outer spans. The term "outer span" refers to the maximum dimension of the particle. Typically, the nanoparticles have diameters or spans of from about 0.1 nm to about 1000 nm, with a preferred range of from about 1 nm to about 100 nm.

Additional Aspects

Preferred aspects and various details associated with preferred aluminum alloys or foil for forming the patterned electrical electrodes or circuits, the laser ablation process, deposition of copper or nickel on the ablated and/or freshly exposed regions of aluminum, and an optional silver deposition operation are as follows.

The aluminum alloy foil or thin layer laminated on a PET or BOPP foil having a thickness of 50 um to 200 um should exhibit various properties. The aluminum alloy should withstand conditions resulting from electrical short circuits, e.g. arcing and temperature increases; withstand thermal expansion and contraction under high temperature conditions; and exhibit relatively high electrical conductivity. Preferred aluminum alloys that exhibit these properties comprise at least 99.5% aluminum.

Table 1 below, lists preferred aluminum alloys that may be used for the preferred embodiments if the aluminum alloys are available in foil form. The most preferred conductivities are obtained with pure aluminum. Thus, for the embodiments described herein, aluminum materials available in foil form and which exhibit relatively high electrical conductivity are preferred.

TABLE 1

Preferred Aluminum Alloys

| Aluminum Alloys | Composition | Tensile Strength (PSI) | Electrical Resistivity Resistance ($10^{-9}$ ohm-m) | Thermal Expansion (um/m-C) | Corrosion Resistance | Foil Form Availability |
| --- | --- | --- | --- | --- | --- | --- |
| 1060-H18 | 99.60% Al | 19000 | 28.3 | 23.6 | | yes |
| 1100 | 99% Al + Cu | 13000 | 30 | 23.6 | | |
| 1199 | 99.996% Al | 6800 | 27 | 23.6 | very good | |
| 1235-H19 | >=99.3% Al | 23900 | 30 | 23.6 | | yes |
| 1350(EC) | 99.5% Al | 13000 | 28 | 23.8 | good | yes |
| 6061 | 97.9% Al + Si, Mg, Cu < Cr | 17000 | 22 | 23.6 | | |
| AA8000 | | 32000 | 30 | 23 | very good | yes |
| Copper (for comparison) | | 50000 | 16.8 | 16.6 | | |

Regarding preferred aspects of the lasers used for ablation, native aluminum oxide is typically a good material to interact with the preferred lasers using corresponding light emission wavelengths. The preferred lasers used for modification and/or oxide removal are Nd:YAG laser at 1064 nm, its frequency doubled version at 532 nm and $CO_2$ lasers at 10.6 um. It will be appreciated that the noted emission wavelengths are merely representative. The present invention methods can utilize other lasers and lasers operating to produce different emissions. The beam of the selected laser preferably includes a homogenizer to homogenously ablate spots on the oxide surface in addition to ablating or otherwise removing larger sized spots such as up to several millimeters as may be required.

Successful results have been obtained by using a laser commercially available under the designation Quanta-Ray INDI by Spectra Physics of Irvine, Calif. with a pulse width of 10 ns and a maximum energy output of 200 mJ/pulse. For mono spot ablation the laser fluence used is between about 1 J/cm$^2$ to about 10 J/cm$^2$.

The time period for laser ablation is based upon appropriate selection of laser, optics, distance to aluminum foil, environment where radiation travels and correct fluence of the laser pulse. Use of beam multipliers and several lasers permit fast operation needed for a roll to roll process of aluminum connectors passivation.

The laser ablation operation preferably occurs in a chamber containing an inert gas such as nitrogen. This process is carried out in absence of oxygen. Aluminum re-oxidizes as quickly as several seconds. And so, a thin oxide forms on freshly exposed aluminum surfaces at room temperature in the presence of air at thickness growth rates of approximately from about 2 nm/sec to about 10 nm/sec. The resulting thin oxide layer is mostly present as native aluminum oxide. There is no particular pressure or temperature requirement for oxides to form. The ablation may be performed in ambient conditions of temperature and pressure in nitrogen or other inert gases such as noble gases for example helium, neon, argon and combinations thereof. Nitrogen is more available and less expensive than most other inert gases. And, so, nitrogen is generally the preferred inert gas for this process.

After laser ablation, the aluminum foil material is then subjected to a deposition, i.e. plating or printing, operation in order to passivate the naked aluminum surface. The metal of choice is silver for its resistance to oxidation, for its high conductivity and also for contact with conductive adhesives that contain silver particles. The galvanic series relationships are useful as a guide for selecting metals to be joined, identifying metals having minimal tendency to interact galvanically, and/or indicating the need or degree of protection to be applied to lessen the expected potential interactions. In general, the further apart the materials are in the galvanic series, the higher the risk of galvanic corrosion, which should be prevented. Conversely, the farther one metal is from another, the greater the potential for corrosion. Aluminum is on the side of anodic (less noble) metals in the series while noble metals like platinum, gold and silver are in the cathodic side of the table. Therefore, it is not recommended to join silver to aluminum directly. For this reason it is preferred to deposit metal or metals with a lower rate of oxidation than aluminum and that are in the middle of the electrolytic list. Examples of these metals include copper and nickel. An aluminum web or sheet can be immersed in a copper or nickel plating bath. For depositing copper, a preferred bath includes cupric sulfate and sulfuric acid. For smoother and better copper deposition, polyethylene glycol (PEG) and sulfopropyl disulfide (SPS) can be added to the electrolyte bath.

For applications in which it is preferred to deposit nickel on the freshly exposed laser ablated aluminum surface, a Watts bath typically used for nickel electroplating is preferred. Watts nickel plating baths can deposit both bright and semi-bright nickel. Although the terms "electroplate" and "plate" are periodically used herein, it will be appreciated that the deposition processes and particularly those using liquid baths, are preferably electroless. However, the present invention includes electrode-based plating or material deposition processes. Table 2 summarizes typical formulations for Watts baths. Bright nickel is typically used for decorative purposes and corrosion protection. Semi-bright deposits are used for engineering nickel where a high luster is not desired.

TABLE 2

Typical Watts Bath

| Chemical Name | Formula | Bright | Semi-bright |
|---|---|---|---|
| Nickel sulfate | NiSO$_4$•6H$_2$O | 20-40 oz/gal | 30-40 oz/gal |
| Nickel chloride | NiCl$_2$•6H$_2$O | 8-20 oz/gal | 4-6 oz/gal |
| Boric acid | B(OH)$_3$ | 5-7 oz/gal | 5-7 oz/gal |

Nickel sulfate is available in commercially pure forms, is relatively inexpensive, and is the major source of the nickel ions in solution.

Nickel chloride serves primarily to increase conductivity and uniformity of coating thickness distribution. Excessive amounts of chloride increase the corrosivity of the internal stress of the deposits. Internal stress refers to forces created within the deposit as a result of the deposition process and/or the codeposition of impurities such as hydrogen, sulfur and other elements. Internal stress is either tensile (contractile), or compressive (expansive), and may cause plating problems if excessively high.

Boric acid is used in nickel plating solutions for buffering purposes. The concentration of boric acid may affect the appearance of the deposits. Wetting agents or surfactants, formulated specifically for nickel plating solutions, may be added to control pitting. Their function is to lower the surface tension of the plating solution so that air and hydrogen bubbles do not attach to the surfaces being plated.

A preferred Watts bath and process conditions are noted below in Table 3.

TABLE 3

Preferred Watts Bath

| | Electrolyte Composition, g/L |
|---|---|
| Nickel Sulfate, NiSO$_4$•6H$_2$O | 225 to 400 |
| Nickel Chloride, NiCl$_2$•6H$_2$O | 30 to 60 |
| Boric Acid, H$_3$BO$_3$ | 30 to 45 |
| Temperature, ° C. | 44 to 66 |
| Agitation | Air or mechanical |
| PH | 2 to 4.5 |
| Tensile Strength, Mpa | 345 to 485 |
| Elongation, % | 10 to 30 |
| Vickers Hardness, 100 gram load | 130 to 200 |
| Internal Stress, Mpa | 125 to 185 (tensile) |

During the plating operation, one or more metals in the bath (such as copper or nickel) deposit on the freshly exposed aluminum in the regions of the aluminum foil that underwent laser ablation or other oxide removal operation(s).

Silver deposition by plating may be carried out immediately on the deposited layers of copper or nickel or can be done later or in another facility. The method of silver plating may be any type of electroless plating i.e. immersion silver or may be done by electroplating for faster processing. The chemicals used for silver immersion are mainly silver nitride based and for electroplating may be silver electrolytes such as for example, Technisol Ag (RTU) from Technic Inc. In electroplating processes there might be some spots of the plating metal deposited on non-ablated regions of the aluminum. However, the adhesion of the plating metal in these regions, i.e. on the oxide layer, is low and can be readily cleaned or removed after the deposition. For most cases, there is no deposition of the plating metal on non-ablated areas of the aluminum. In view of this, for certain applications such as PV-CSB, only very small surface areas such as several millimeters in diameter need to be plated for subsequent connection to silicon cell pads via conductive paste. The aluminum oxide on the surface of the aluminum foil outside of the ablated areas prevents adherence of other metals in electroless plating as well such that the copper or nickel particles do not adhere to the aluminum foil surface except on the ablated areas.

Assemblies

The apparatuses and methods disclosed herein are described in detail by way of examples and with reference to the figures. Unless otherwise specified, like numbers in the figures indicate references to the same, similar, or corresponding elements throughout the figures. It will be appreciated that modifications to disclosed and described examples, arrangements, configurations, components, elements, apparatuses, methods, materials, etc. can be made and may be desired for a specific application. In this disclosure, any identification of specific shapes, materials, techniques, arrangements, etc. are either related to a specific example presented or are merely a general description of such a shape, material, technique, arrangement, etc. Identifications of specific details or examples are not intended to be, and should not be, construed as mandatory or limiting unless specifically designated as such. Selected examples of apparatuses and methods are hereinafter disclosed and described in detail with reference made to FIGS. 1-5.

Figure 1:
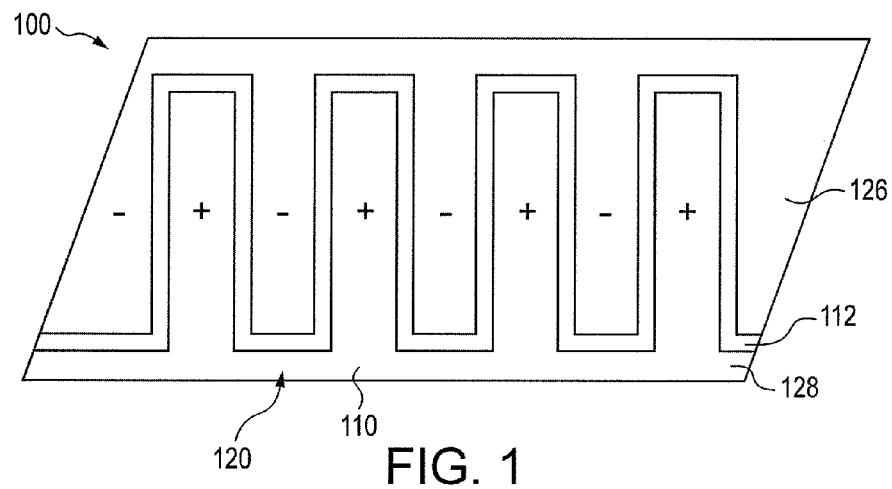
FIG. 1 depicts a planar view of a substrate and patterned aluminum conductive elements.

Reference is now directed to FIG. 1 which illustrates an assembly 100 comprising a patterned aluminum layer 120 provided on an upper surface of a substrate 110. Aluminum conductive elements 126 and 128 are separated by an area 112 free of aluminum conductive elements. When used to form circuitry, the aluminum conductive element 126 can be used to electrically connect one terminal (negative or positive terminal) with other parts of the circuitry. And the aluminum conductive element 128 can be used to electrically connect the second terminal with other parts of the circuitry. Multiple regions or components of the circuitry can be connected in series or in parallel to the assembly 100. The pattern of the aluminum layer 120 can be any pattern such that a specific electrical circuit is provided as desired, and not necessarily the same as shown in FIG. 1.

Figure 2A:
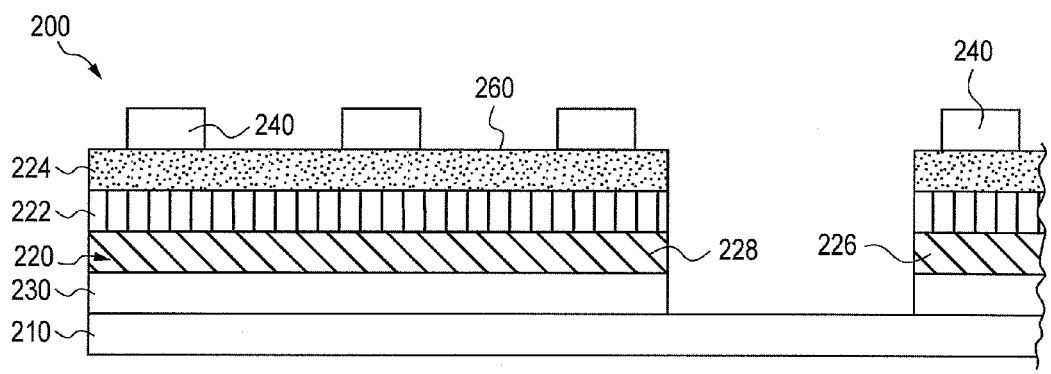
FIGS. 2A and 2B are schematic cross sectional views of preferred embodiment sheet assemblies in accordance with the present invention.
Figure 2B:
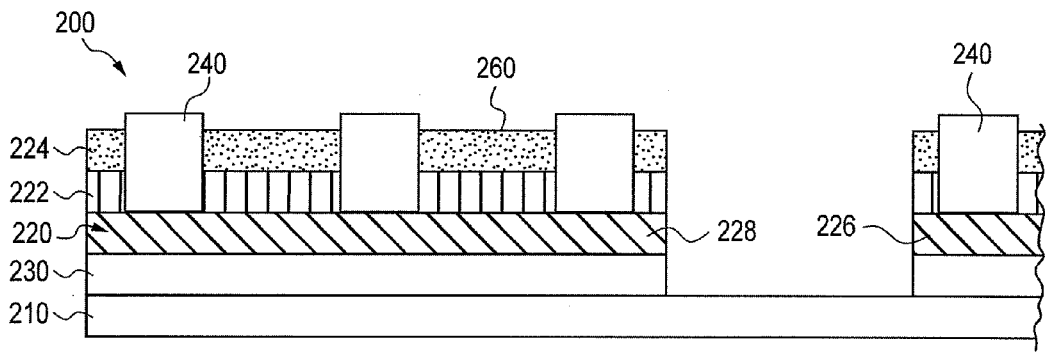

FIGS. 2A and 2B are exemplary cross-sectional views of preferred embodiment sheet assemblies with patterned aluminum conductive elements. These sheet assemblies 200 include a carrier substrate 210, a laminate adhesive layer 230, a patterned aluminum conductive layer 220 with aluminum elements 226 and 228, a passivation layer 222, a silver (Ag) layer 224, and a dielectric layer 240. The patterned aluminum conductive layer 220 corresponds to the previously described patterned aluminum layer 120. In FIG. 2A, the surface treatment layer 222 and the silver layer 224 are disposed on the aluminum layer 220 and are the same size as the aluminum layer 220. The dielectric layer 240 is deposited on the silver layer 224 to cover the silver surface at discrete locations. The areas 260 not covered by the dielectric layer 240 are the electrodes. Alternatively in FIG. 2B, the dielectric layer 240 is deposited over the aluminum layer 220 to cover the aluminum surface at discrete locations. The passivation layer 222 and the silver layer 224 are disposed on the aluminum layer 220 at locations free of any dielectric materials to form the electrodes 260.

The carrier substrate 210 provides mechanical strength and protection to the sheet assemblies. Examples of materials for the substrate include, but are not limited to, polyester films, polyethylene terephthalate films, polyimide films, PEN or paper materials such as card stock paper, bond paper, etc. The adhesive layer 230 bonds the aluminum conductive layer 220 with the carrier substrate 210. The adhesive layer can be a structural adhesive such as epoxy based curable adhesives, or pressure sensitive adhesives such as acrylic or rubber based pressure sensitive adhesives. The aluminum conductive layer 220 is preferably patterned so that the layer 220 forms a complete circuit when aligned or otherwise incorporated with another part of an electronic module, such as a RFID chip, RFID strap for a RFID tag, or a crystalline silicon (c-Si) cell for a photovoltaic module.

Since aluminum is typically oxidized upon exposure to air, surface treatment is preferred to protect the aluminum surface and maintain the electrical conductivity of that layer or component. The passivation layer 222 is the result of such surface treatment. The surface treatment layer 222 can include a wide array of materials. The surface treatment layer can comprise zinc resulting from immersion or contact with a zincate solution wherein zinc is deposited as described by reaction (I). The surface treatment layer can comprise copper or nickel as previously described herein. One example is to use zincates in combination with nickel (Ni) or copper (Cu). The nickel or copper layer can be applied by use of an electrolytic or electroless plating process. The nickel or copper layer can also be applied by one or more printing techniques as previously described herein. A typical thickness for this electrically conductive layer is from about 10 nm to about 300 nm. However, the invention includes layer thicknesses less than and greater than these values. The layer thickness of these metals preferably ranges from about 10 nm to about 100 nm. Thicker layers are acceptable, however are less economical. Preferred electroless Ni plating solutions include Niklad 752 or Niklad 724 commercially available from MacDermid.

A silver layer 224 is further applied over the passivation layer 222 to enhance the electrical contact of the aluminum conductive layer 220. An example of silver material that can be used for such purpose is Helios Silver IM 560 from MacDermid. The silver layer can be applied through an electrolytic or electroless plating process. Printing techniques as previously described herein can also be used to form the liver layer. A preferred process utilizes electroless silver plating with a silver layer having a thickness of approximately 200 nm to provide corrosion resistance.

When forming electrical circuitry through alignment of the sheet assembly with patterned aluminum electrodes with another component of a circuit, care needs to be taken so that no electrical shortage occurs. To avoid such electrical shortage, a dielectric material is preferably deposited at discrete locations on the aluminum layer 220 to form a dielectric layer 240. This layer is generally referred to herein as an interlayer dielectric (ILD). Representative materials for the interlayer dielectric include UV curable dielectric inks. The key requirements for the interlayer dielectric material are bonding adhesion to the conductive surface, the dielectric consistence and thermal/dimension stabilities. Preferably, the interlayer dielectric material is in the form of an ink. A typical ILD ink, such as SunTronic Dielectric 680 (CFSN6052), is commercially available from SunChemical, Norton Hill, Midsomer Norton Bath, BA3 4RT, England. Preferably, the interlayer dielectric material is applied onto the conductor by a screen printing process. The applied interlayer dielectric material is then subjected to a UV curing step for example by exposure to UV light at 650 mJ/m$^2$ intensity. The desired target thickness is about 10 to about 30 um and most preferably about 20 um to ensure the layer is pinhole-free or free of other defects.

Figure 3:
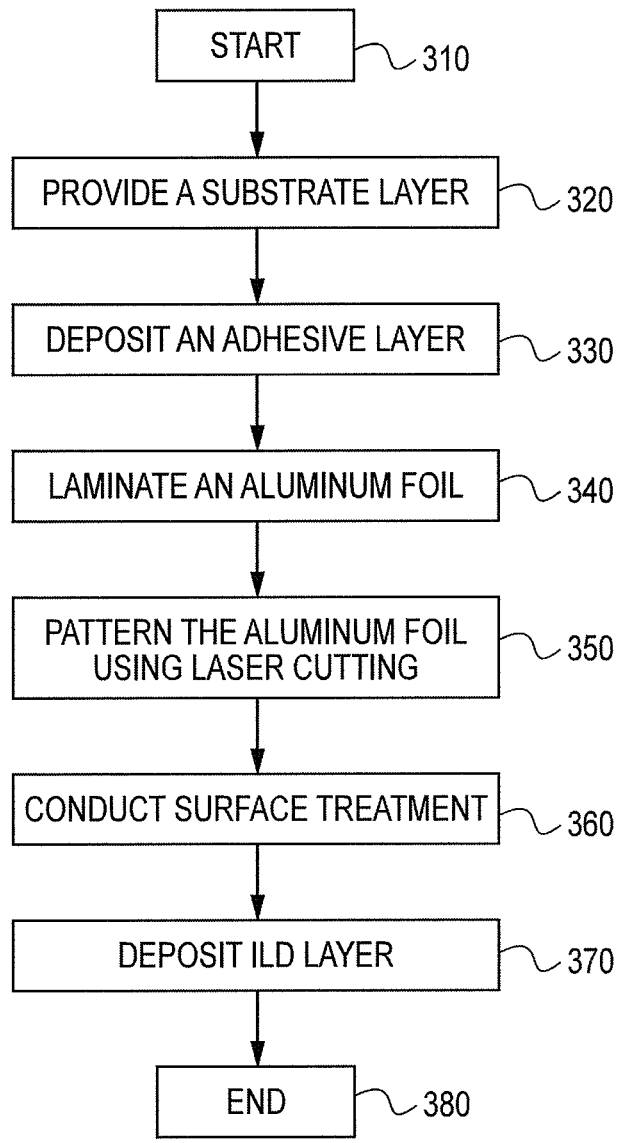
FIG. 3 depicts a process for manufacturing a sheet assembly in accordance with the present invention.

The patterned aluminum conductive layer can be made with the following process as shown in FIG. 3. Starting at step 310, a substrate layer 210 (see FIGS. 2A and 2B is provided in step 320. Then an adhesive layer 230 (FIGS. 2A and 2B) is deposited over the substrate layer at step 330. The adhesive may be applied to the carrier substrate 210 by flood coating, roll coating, screen printing, digital printing, or other type of pattern printing process. Then an aluminum foil can be laminated on the substrate layer through the adhesive layer at step 340. The aluminum foil can then be patterned through a laser cutting process at step 350. This process has been described in detail in pending U.S. patent application Ser. Nos. 61/354,380, 61/354,388 and 61/354,393, all of which are incorporated by reference in their entireties. Other methods known to cut and pattern a foil can be used as well. The patterned aluminum conductive layer is then treated in step 360 followed by deposition of an ILD layer on the aluminum surfaces. One exemplary process for the treatment step is to use a laser to etch off the oxide layer at desired spots where electrical connection is to be made with the back contact a c-Si cell, followed by deposition of a passivation layer. Another exemplary process for this step is to use wet chemical etching. In a wet chemical etching operation, the aluminum surface is first cleaned using the previously noted Helios Al Acid Etch 901 available from MacDermid. Then the surface treatment layer is deposited on the freshly cleaned aluminum surface. The deposition can be performed through a wet chemical processes with a cyanide free liquid zincate solution commercially available under the designation Metex 6811 from MacDermid, as previously noted. The freshly prepared aluminum substrate is submerged in the prepared Metex 6811 solution for a time period of from about 10 to about 60 seconds and preferably about 30 seconds, then the substrate is rinsed with deionized (DI) water. Then, the laser ablated surface or the zincate treated surface is submerged in the previously noted Niklad 752 electroless nickel plating solution available from Mac-Dermid at from about 55 to about 75° C. and preferably about 65° C. for about 3 to about 20 minutes, and preferably about 8 minutes. The treated substrate is rinsed with DI water. The zinc and nickel treated substrate is submerged into an electroless silver plating solution such as Helios Silver IM 560 PreDip and Helios Silver IM 560 Silver bath both available from MacDermid. The preferred process condition is from about 20 to about 45 seconds, and preferably about 30 seconds, 40° C. in PreDip solution and from about 60 to about 180 seconds, and preferably about 90 seconds, 50° C. in the Silver bath solution. These processes selectively plate only the metal surface. Therefore, only the exposed metal surfaces that are not covered by the interlayer dielectric material layer are plated with zinc, nickel and silver. The process ends at step 380.

In another exemplary process, the interlayer dielectric material layer is deposited on the aluminum surface after the pattern forming process, with die-cutting or laser cutting. The surface treatment is then conducted on the exposed aluminum surface, i.e. where there is no interlayer dielectric material.

The thickness of each layer in the preferred embodiment assemblies depicted in FIGS. 2A and 2B is as follows. The thickness of the carrier substrate is from about 1 mil to about 25 mils. The thickness of the adhesive layer is from about 1μ to about 25μ. The thickness of the aluminum foil can be from about 10μ to about 200μ. The thickness of the surface treatment layer can be from about 0.01μ to about 0.3μ and preferably about 0.01μ to about 0.1μ. The thickness of the silver layer can be from about 0.05μ to about 10μ. The thickness of the dielectric materials can be from about 10μ to about 100μ.

Figure 4:
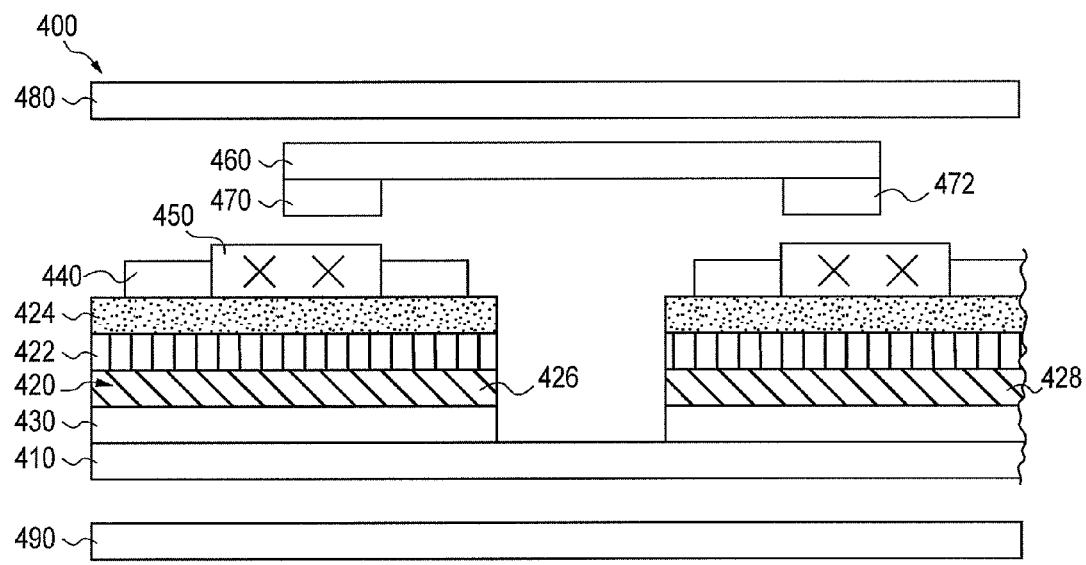
FIG. 4 is a schematic cross sectional view of a preferred embodiment photovoltaic cell in accordance with the present invention.

Referring to FIG. 4, an exemplary cross-sectional view of a preferred embodiment photovoltaic cell 400 is illustrated. A sheet assembly includes a carrier layer 410, an adhesive layer 430, a patterned aluminum conductive layer 420 with aluminum conductive elements 426 and 428, a surface treatment layer 422 over the patterned aluminum conductive layer 420, a silver layer 424 over the surface treatment layer 422, an isotropic conductive paste (ICP) layer 450 applied over the silver layer 424 to bond the sheet assembly with a c-Si cell 460. Each c-Si cell 460 has two terminals 470 and 472, one positive and one negative. When in contact through the isotropic conductive paste layer 450, the c-Si cell 460, the terminals 470 and 472, and the patterned aluminum elements 426 and 426 with silver on them form a complete circuit. A dielectric layer 440 is deposited on discrete locations of the patterned aluminum conductive elements. In this particular example, the isotropic conductive paste 450 is deposited between two dielectric regions over the area of the electrodes. Preferably, the photovoltaic cell includes a protective front cover 480 and a back cover 490.

EXAMPLES

Several evaluations were performed to further investigate various aspects of the preferred embodiments described herein.

Example 1

A preferred embodiment backsheet assembly was formed as described herein using a substrate of PET, an aluminum foil, and an adhesive layer disposed between the substrate and the aluminum foil layer. The thickness of the PET substrate was 5 mils. The thickness of the adhesive layer was 3μ. And, the thickness of the aluminum foil was 20μ. The aluminum foil was laser cut into 1 mm by 5 mm strips. The aluminum conductive layer was then treated by forming a layer of zinc thereon by use of a zincate solution and then applying a nickel mixture to form various samples.

Example 2

Copper in the form of a thin foil laminated to PET was obtained from Toray Company under the brand name S10. Samples were prepared from this material and constituted a comparative example.

Figure 5:
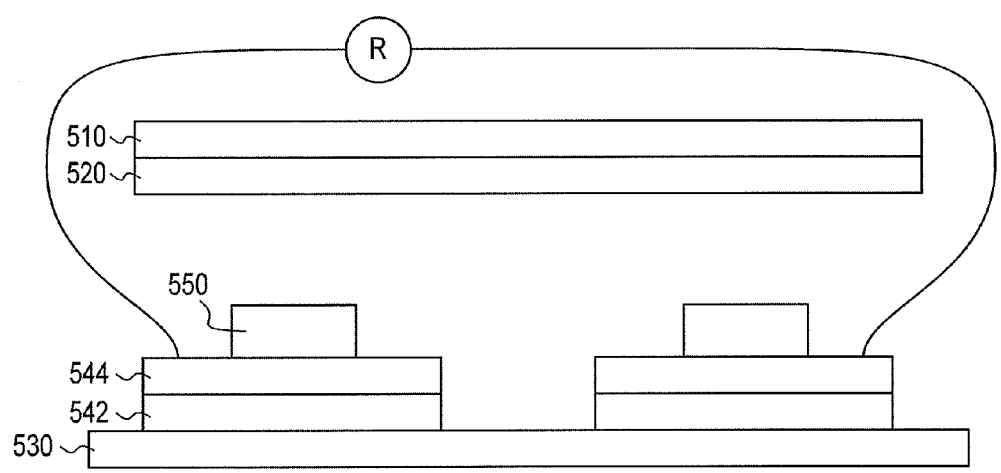
FIG. 5 is a schematic cross sectional view of a testing configuration utilized in several evaluation trials described herein.

The samples formed in Examples 1 and 2 were tested for stability through measurement of electrical resistance. The testing configuration is schematically illustrated in FIG. 5. A PET substrate 530 with two contact terminals 542 made of copper coated with a layer 544 of silver was bonded with the various samples with a carrier sheet 510 and conductive element 520 through the use of isotropic conductive paste 550. The electrical resistance between the two silver contacts 544 was measured at ambient conditions. Measurements were taken after the bonding and the sample was aged at 85° C. and 85% humidity for various amount of time. Samples in accordance with preferred embodiments of the invention were stable for the entire testing period of 25 weeks, and comparable to the copper comparative examples.

Example 3

In yet another evaluation, one sample was prepared using a wet chemical process (Assembly A) and another sample was prepared using a dry laser ablation (Assembly B) process. An aluminum foil (Control A) and a commercially available silver coated copper strap (Control B) were used as the reference control samples. The electrical resistance between two contacts as previously described with regard to Example 2 and schematically depicted in FIG. 5 was measured for each sample over a time period of 25 weeks. The results of this evaluation are presented in Table 4. It is apparent that the assemblies made in accordance with the preferred embodiment methods have dramatically lower electrical resistance, i.e., much better electrical conductivity as compared to the untreated aluminum foil. The electrical resistance of each sample is comparable to commercially available silver coated copper strap. And the assemblies are stable throughout the 25 weeks of testing.

TABLE 4

Summary of Electrical Resistance Measurements of Samples

| Time (weeks) | Control A Al foil (ohm) | Control B Ag/Cu strap ($10^{-3}$ ohm) | Assembly A Ag/Al strap (wet process) ($10^{-3}$ ohm) | Assembly B Ag/Ni/Al strap (laser ablated) ($10^{-3}$ ohm) |
|---|---|---|---|---|
| 0 | 29.6 | 1 | 1 | 3 |
| 1 | 20.9 | 2 | 2 | 3 |
| 2 | 22.1 | 2 | 2 | 3 |
| 3 | 22.8 | 2 | 2 | 3 |
| 4 | 23.5 | 2 | 2 | |
| 5 | 25.4 | 2 | 2 | 4 |
| 6 | 26.1 | 2 | 2 | |
| 7 | 26.5 | 2 | 2 | |
| 8 | 27.7 | 2 | 2 | 4 |
| 10 | 30.0 | 2 | 2 | |
| 12 | | 2 | 2 | |
| 13 | | | | 4 |
| 14 | | | | |
| 16 | | 2 | 2 | |
| 19 | | | | |
| 22 | | 2 | 2 | |
| 25 | | 2 | 2 | |

Many other benefits will no doubt become apparent from future application and development of this technology.

Additional details as to assemblies, components, and processes for forming conductive connections, contacts and particularly for photovoltaic cells are provided in U.S. Pat. No. 7,759,158 to Bachrach; and U.S. Pat. Nos. 5,468,652 and 5,951,786 both to Gee.

All patents, published applications, and articles noted herein are hereby incorporated by reference in their entirety.

It will be understood that any one or more feature or component of one embodiment described herein can be combined with one or more other features or components of another embodiment. Thus, the present invention includes any and all combinations of components or features of the embodiments described herein.

As described hereinabove, the present invention solves many problems associated with previous type devices. However, it will be appreciated that various changes in the details, materials and arrangements of parts, which have been herein described and illustrated in order to explain the nature of the invention, may be made by those skilled in the art without departing from the principle and scope of the invention, as expressed in the appended claims.

What is claimed is:

1. A method of forming an oxidation resistant aluminum based electrode on an aluminum foil laminate for a photovoltaic back contact c-Si cell, the method comprising:
    providing an aluminum foil laminate including an aluminum foil having a layer of oxidation on the aluminum foil;
    patterning the aluminum foil of the aluminum foil laminate;
    providing an oxygen-free atmosphere along an outer surface of the aluminum foil;
    removing at least a portion of the oxidation from a portion of the aluminum foil to thereby form a region of freshly exposed aluminum; and
    depositing at least one layer of an electrically conductive material on the region of freshly exposed aluminum to thereby form the oxidation resistant aluminum based electrode.

2. The method of claim 1 further comprising:
    after depositing the layer of the electrically conductive material, depositing a layer of silver on the electrically conductive material.

3. The method of claim 2 wherein depositing of the layer of silver is performed by contacting a silver bath formulation with the electrically conductive material.

4. The method of claim 2 wherein the depositing of the layer of silver is performed by:
    providing a composition including particles of silver dispersed in a carrier; and
    printing the composition on the electrically conductive material.

5. The method of claim 4 wherein the particles of silver are nanoparticles.

6. The method of claim 1 wherein the removing of at least a portion of the oxidation is performed by applying an etchant to the oxidation.

7. The method of claim 6 wherein the etchant is a liquid acidic etchant.

8. The method of claim 7 wherein the etchant includes at least one acid selected from a group consisting of sulfuric acid, nitric acid and phosphoric acid.

9. The method of claim 1 wherein the removing of at least a portion of the oxidation is performed by laser ablation.

10. The method of claim 1 wherein the oxygen-free atmosphere includes at least one inert gas selected from a group consisting of nitrogen, helium, neon, argon, and combinations thereof.

11. The method of claim 1 wherein the depositing of the at least one layer of an electrically conductive material is performed by contacting a zincate solution with the freshly exposed aluminum to thereby form a layer of zinc on the aluminum, and then depositing a layer of copper or nickel on the layer of zinc.

12. The method of claim 1 wherein the depositing of the at least one layer of an electrically conductive material is performed by contacting a copper bath formulation with the freshly exposed aluminum to thereby form a layer of copper on the aluminum.

13. The method of claim 12 wherein the copper bath formulation comprises cupric sulfate and sulfuric acid.

14. The method of claim 1 wherein the depositing of the layer of an electrically conductive material is performed by contacting a nickel bath formulation with the freshly exposed aluminum to thereby form a layer of nickel on the aluminum.

15. The method of claim 14 wherein the nickel bath formulation comprises nickel sulfate, nickel chloride, and boric acid.

16. The method of claim 1 wherein the depositing of the at least one layer of an electrically conductive material is performed by:
    providing a composition including particles of the electrically conductive material dispersed in a carrier; and printing the composition on the freshly exposed aluminum.

17. The method of claim 16 wherein the electrically conductive material includes copper particles.

18. The method of claim 16 wherein the electrically conductive material includes nickel particles.

19. The method of claim 16 wherein the particles are nanoparticles.

20. The method of claim 1, wherein the electrically conductive material is copper, and further comprising:
  after depositing the layer of the electrically conductive material, depositing a layer of organic solderability preservative (OSP) on the electrically conductive material.

21. The oxidation resistant aluminum based electrode on an aluminum foil laminate as formed by the methods of claim 1.

* * * * *